(12) United States Patent
Branton

(10) Patent No.: US 8,749,968 B1
(45) Date of Patent: Jun. 10, 2014

(54) LIQUID COOLING SYSTEM FOR A SERVER

(71) Applicant: Asetek A/S, Brønderslev (DK)

(72) Inventor: Steven B. Branton, Ventura, CA (US)

(73) Assignee: Asetek A/S, Broenderslev (DK)

( * ) Notice: Subject to any disclaimer, the term of this patent is extended or adjusted under 35 U.S.C. 154(b) by 0 days.

(21) Appl. No.: 14/186,397

(22) Filed: Feb. 21, 2014

Related U.S. Application Data

(63) Continuation of application No. 13/215,384, filed on Aug. 23, 2011.

(60) Provisional application No. 61/377,249, filed on Aug. 26, 2010.

(51) Int. Cl.
*H05K 7/20* (2006.01)

(52) U.S. Cl.
USPC ...... 361/679.53; 361/696; 361/697; 361/698; 361/699; 165/80.4

(58) Field of Classification Search
None
See application file for complete search history.

(56) References Cited

U.S. PATENT DOCUMENTS

| | | | |
|---|---|---|---|
| 6,807,056 B2 | 10/2004 | Kondo et al. | |
| 6,819,563 B1 | 11/2004 | Chu et al. | |
| 6,896,612 B1 | 5/2005 | Novotny | |
| 7,012,807 B2 | 3/2006 | Chu et al. | |
| 7,420,804 B2 | 9/2008 | Leija et al. | |
| 7,438,124 B2 | 10/2008 | Bhatti et al. | |
| 7,599,184 B2 * | 10/2009 | Upadhya et al. | 361/699 |
| 7,957,132 B2 | 6/2011 | Fried | |
| 8,094,453 B2 * | 1/2012 | Campbell et al. | 361/699 |
| 8,274,787 B2 | 9/2012 | Alyaser et al. | |
| 8,289,710 B2 | 10/2012 | Spearing et al. | |
| 8,427,831 B2 | 4/2013 | Wei | |
| 8,493,738 B2 * | 7/2013 | Chainer et al. | 361/700 |
| 2004/0095721 A1 | 5/2004 | Ellsworth et al. | |
| 2007/0297136 A1 * | 12/2007 | Konshak | 361/699 |
| 2008/0068793 A1 | 3/2008 | Ishimine | |
| 2009/0027856 A1 | 1/2009 | McCoy | |
| 2009/0056910 A1 | 3/2009 | Mallia et al. | |
| 2009/0086434 A1 | 4/2009 | Hodes et al. | |
| 2009/0126910 A1 | 5/2009 | Campbell et al. | |
| 2009/0154096 A1 | 6/2009 | Iyengar et al. | |
| 2010/0085708 A1 * | 4/2010 | Martin et al. | 361/696 |

FOREIGN PATENT DOCUMENTS

WO WO 2010/054786 A1 5/2010

OTHER PUBLICATIONS

International Search Report and Written Opinion for International Application No. PCT/US2011/048735 dated Dec. 2, 2011, 12 pages.

* cited by examiner

*Primary Examiner* — Boris Chervinsky
(74) *Attorney, Agent, or Firm* — Finnegan, Henderson, Farabow, Garrett & Dunner, LLP

(57) ABSTRACT

A method of cooling a computer server that includes a plurality of server modules, and is positioned in an enclosed room, includes transferring heat generated by a server module of the plurality of server modules to a hot plate of a liquid cooling system. The liquid cooling system may be positioned within the server module, and the hot plate may have a surface exposed to the enclosed room. The method may also include positioning a cold plate of a room-level cooling system in thermal contact with the hot plate. The method may also include directing a cooling medium through the room-level cooling system to transfer heat from the hot plate to a cooling unit positioned outside the room.

15 Claims, 8 Drawing Sheets

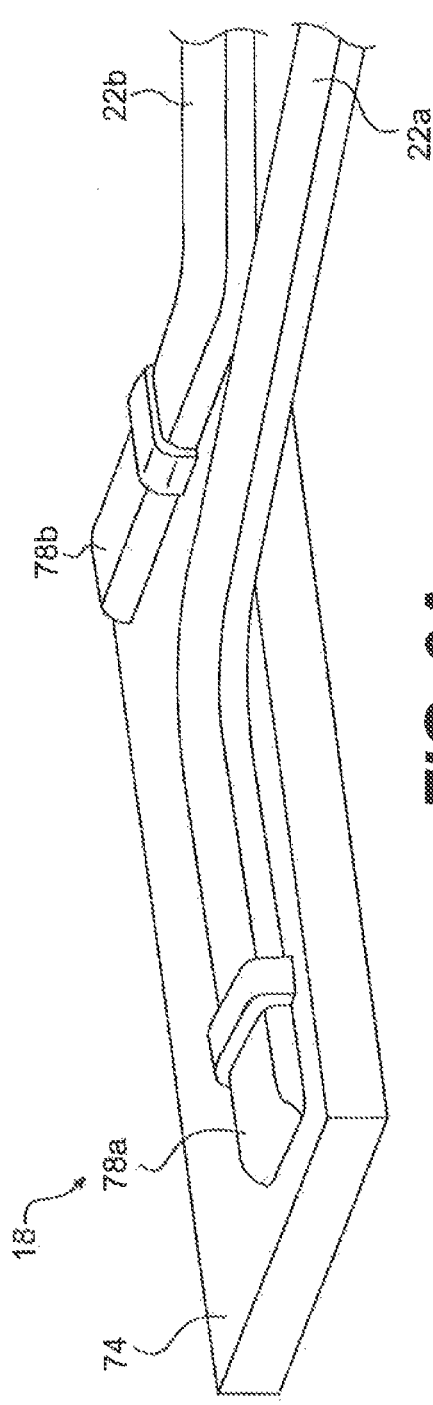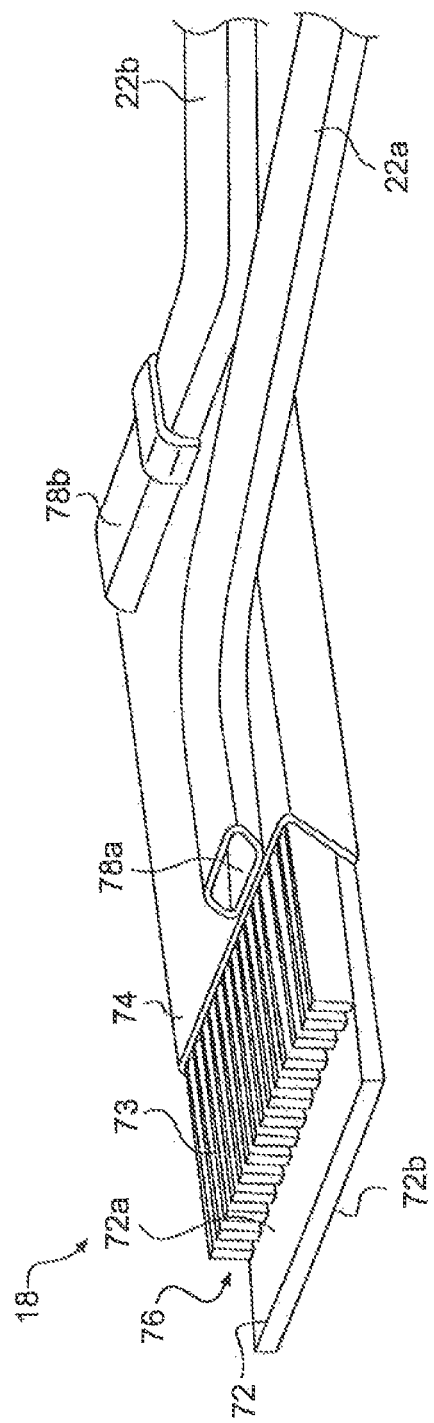

LIQUID COOLING SYSTEM FOR A SERVER

I. CROSS REFERENCE TO RELATED APPLICATIONS

This application is a continuation of U.S. application Ser. No. 13/215,384, filed on Aug. 23, 2011, which claims priority to Provisional Application No. 61/377,249 filed on Aug. 26, 2010, which are incorporated herein by reference in their entirety.

II. TECHNICAL FIELD

The present invention is related generally to systems and methods of cooling heat generating components of a computer server or other systems that operate in an enclosed data processing environment, and computer servers and systems incorporating the cooling system.

III. BACKGROUND

Electronic systems, such as, for example, computer systems include several integrated circuit (IC) devices that generate heat during operation. For effective operation of the computer system, the temperature of the IC devices have to be maintained within acceptable limits. While the problem of heat removal from IC devices is an old one, this problem has increased in recent years due to greater numbers of transistors that are packed into a single IC device while reducing the physical size of the device. Increasing number of transistors compacted into a smaller area results in a greater concentration of heat that must be removed from that smaller area. Bundling multiple computer systems together, such as, for example, in a server, further aggravates the heat removal problem by increasing the amount of heat that has to be removed from a relatively small area.

In a typical computer server ("server"), multiple computer server modules ("modules") are stacked together in a rack or a case to consolidate network resources and minimize floor space. Modules which are designed for use in a server configuration are typically characterized by a motherboard comprising heat generating electronic components (such as IC devices) housed in a modular chassis or case, which in turn is mounted together with other similar modules, in a rack, blade cabinet, blade server, or other support structure. In practice, multiple servers (each comprising several modules) are typically located in an enclosed space such as a server room or a data center. During operation, the electronic components in the individual modules generate heat which must be removed for effective functioning of the server. FIG. 1 illustrates a prior art method used to cool multiple servers (each containing multiple modules) housed in an enclosed environment such as, for example, a server room. In such a prior art system, cooling fans are used circulate ambient air from the server room through the multiple modules of a server to absorb heat therefrom. In the prior art system, cool air directed into the server room through a cold air plenum is passed through the servers to absorb heat generated by IC devices and other heat generating components therein. After absorbing the generated heat, the heated air is exhausted back into the server room. This heated air is directed through a warm air plenum to a computer room air conditioning (CRAC) system to cool the air and recirculate it back to the server room through the cold air plenum.

It is known that a large portion (greater than about 31%) of the energy consumption of a typical server room is used in the operation of the CRAC system, and that significant energy savings and resultant green house gas reduction can be achieved by improving the efficiency of the CRAC system. "Data Center Energy Characterization Study Site Report," February 2001, available at http://hightech.lbl.gov/documents/DATA_CENTERS/DC_Benchmarking/Data_Center_Facility1.pdf; "Energy Consumption of Information Technology Data Centers," and references cited therein, Iyengar et al., December 2010, available at http://www.electronics-cooling.com/2010/12/energy-consumption-of-information-technology-data-centers/. Improving the cooling efficiency of servers housed in a server room thereby enables more efficient utilization and conservation of available energy resources, and green house gas emission reduction.

The disclosed liquid cooling systems and methods are directed to an energy efficient approach of cooling one or more servers located in an enclosed environment, such as a server room.

IV. SUMMARY OF THE DISCLOSURE

In one aspect, a method of cooling a computer server that includes a plurality of server modules, and is positioned in an enclosed room, is disclosed. The method includes transferring heat generated by a server module of the plurality of server modules to a hot plate of a liquid cooling system. The liquid cooling system may be positioned within the server module, and the hot plate may have a surface exposed to the enclosed room. The method may also include positioning a cold plate of a room-level cooling system in thermal contact with the hot plate. The method may further include directing a cooling medium through the room-level cooling system to transfer heat from the hot plate to a cooling unit positioned outside the room.

In another aspect, a method of cooling a computer server including a plurality of server modules is disclosed. The method may include maintaining a flow of air within a server module of the plurality of server modules to absorb heat from one or more heat generating devices of the server module. The method may also include directing the flow of air through an air-to-liquid heat exchanger of a closed loop liquid cooling system to transfer the absorbed heat to a coolant of the liquid cooling system. The liquid cooling system may be positioned within the server module. The method may also include directing the coolant to a hot plate of the liquid cooling system. The hot plate may be positioned such that at least a heat exchange surface of the hot plate is exposed outside the server module. The method may further include transferring heat from the hot plate to a location remote from the computer server using a cooling medium of a second closed loop cooling system positioned outside the server module.

In yet another aspect, a method of cooling a plurality of computer servers positioned in a server room is disclosed. The method may include transferring heat generated by each computer server of the plurality of computer servers to an exterior of the computer server using a closed loop liquid cooling system positioned within the computer server. The method may also include thermally coupling a second closed loop cooling system to the liquid cooling system of the computer server. The method may also include circulating a cooling medium through the second closed loop cooling system to transfer heat from the liquid cooling system of the computer server to a location outside the server room.

V. BRIEF DESCRIPTION OF THE DRAWINGS

FIG. 6A is an illustration of an exemplary hot plate used in the disclosed cooling system; and FIG. 6B is an exploded view of the cold plate of FIG. 6A.

VI. DETAILED DESCRIPTION

The following detailed description illustrates the cooling system by way of example and not by way of limitation. Although the description below describes an application of a liquid cooling system to servers housed in an enclosed environment, embodiments of the disclosed cooling systems may be applied to cool heat generating components in any application. For example, embodiments of the current disclosure may be used to cool portable computers that operate while being docked to a docking station. The description enables one skilled in the art to make and use the present disclosure for cooling any electronic component within a console or a chassis.

Reference will now be made to exemplary embodiments of the invention, examples of which are illustrated in the accompanying drawings. Wherever possible, the same reference numbers will be used throughout the drawings to refer to the same or like parts. Elements or parts designated using the same reference numbers in different figures perform similar functions. Therefore, for the sake of brevity, these elements may not be described with reference to every figure. In the description that follows, if an element is not described with reference to a figure, the description of the element made with reference to another figure applies.

Figure 1:
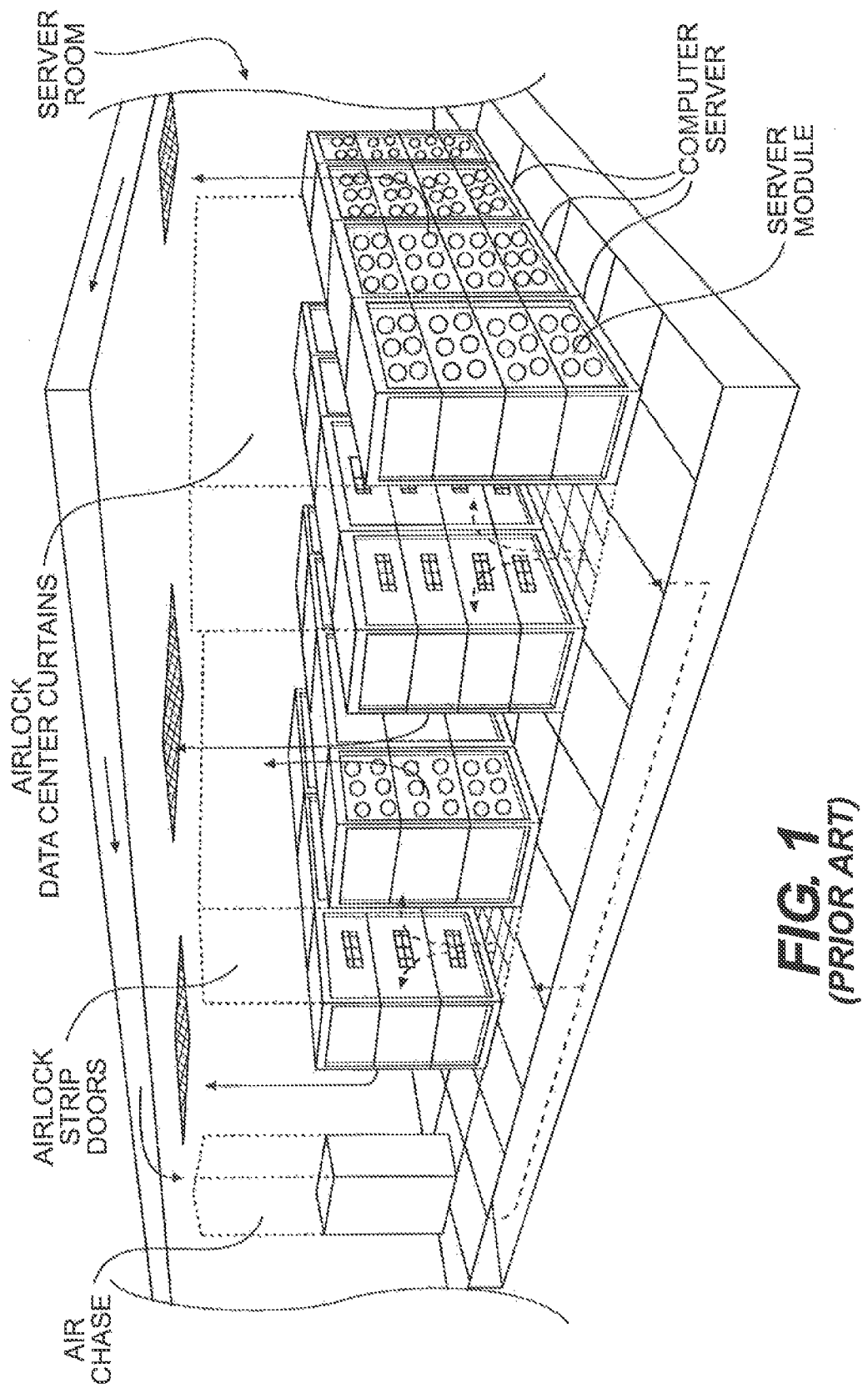
FIG. 1 illustrates a prior art server room cooling system.
Figure 2A:
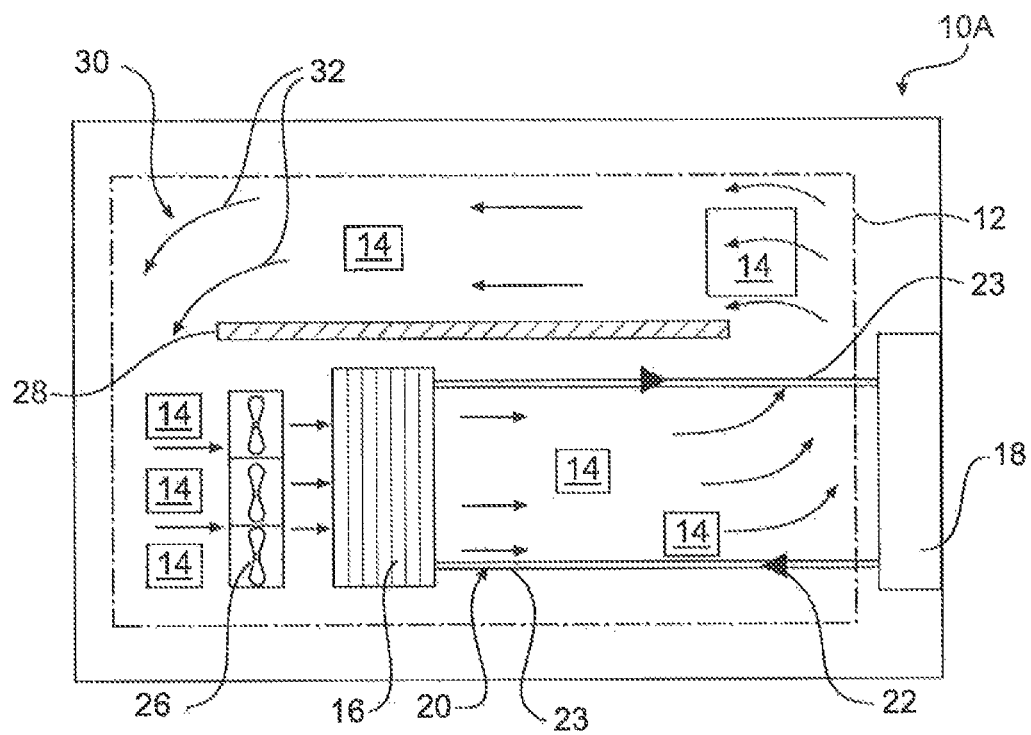
FIG. 2A is an illustration of an exemplary embodiment of the disclosed cooling system applied to a server module.

FIG. 2A illustrates an exemplary individual computer server unit (or a module 10A) having a modular chassis adapted for placement in a server rack. Module 10A includes a motherboard 12 having mounted thereon (or attached thereto, such as, for example, by using a data cable) a plurality of heat generating electronic devices 14. These electronic devices 14 may include, without limitation, any type of IC or other devices (such as, for example, CPUs, GPUs, memory, power supplies, disk drives, controllers, etc.) that are found in typical computer systems. Module 10A may also include a closed loop liquid cooling system 20 and an air cooling system 30. The air cooling system 30 may include a volume of air 32 circulated within the module 10A by fans 26 or other air moving devices. In some embodiments, module 10A may include air directing channels or walls 28 positioned to direct the air flow in a desired pattern within the module 10A. Air 32 circulating within the module 10A may remove heat from, and cool, some or all of the electronic devices 14 contained within the module 10A. The liquid cooling system 20 of the module 10A may remove the heat from the air 32 and transfer the heat to a liquid coolant ("coolant 22") circulating within the liquid cooling system 20.

The liquid cooling system 20 may include one or more air-to-liquid heat exchangers (HEX 16) for interacting with the circulating internal air 32 and transferring the heat from the air 32 to the coolant 22. The liquid cooling system 20 may also include one or more hot plates 18. Although, for the sake of clarity, only one hot plate 18 is illustrated in FIG. 2A (and in the other figures), in general the liquid cooling system 20 may have any number of hot plates 18. The coolant 22 may absorb heat from the air 32 at HEX 16 and flow to the hot plate 18. At the hot plate 18, the heated coolant 22 may transfer the heat to the hot plate 18 and get cooled thereby. The relatively cooler coolant 22 may then flow back to HEX 16 to absorb more heat from air 32 flowing through the HEX 16 and continue the cycle. Conduits 23 may fluidly couple the one or more heat exchangers 16 to the hot plate 18. Although in general, the hot plate 18 may be positioned anywhere in module 10A, in some embodiments, the hot plate 18 may be positioned proximate to, or on, an external surface of the module 10A. In embodiments having a plurality of hot plates 18, these hot plates 18 may be positioned proximate the same location or at different locations. In some embodiments, all, or a majority of these plurality of hot plates 18 may be positioned proximate to, or on, an external surface of module 10A. In some embodiments, the liquid cooling system 20 may also include pumps or other liquid moving devices (not shown) to assist in transferring the coolant 22 between HEX 16 and the hot plate 18. Alternatively, some configurations of the liquid cooling system 20 system may not include a pump, and instead, rely upon the expansion and contraction of the coolant 22 as it absorbs and dissipates heat to propel the coolant 22 between the HEX 16 and the hot plate 18. Any liquid, such as, for example, water, alcohol, mixtures of alcohol and water, etc. may be used as coolant 22. Although coolant 22 is described as a liquid, in some embodiments, a phase change material may be used as the coolant 22. In these embodiments, a coolant 22 in a liquid phase may transform to a gaseous phase after absorption of heat at HEX 16. The coolant 22 may transform back to the liquid phase after transferring the absorbed heat to the hot plate 18. In some embodiments, valves or other known fluid control devices (not shown) may be provided in the liquid cooling system 20 to control the flow of the coolant 22 therein. Further, it is also contemplated that in some embodiments, the liquid cooling system 20 may be an open loop system instead of a closed loop system. In such an embodiment, the heated coolant 22 from the HEX 16 may be replaced with cooler coolant from outside the cooling system.

Figure 2B:
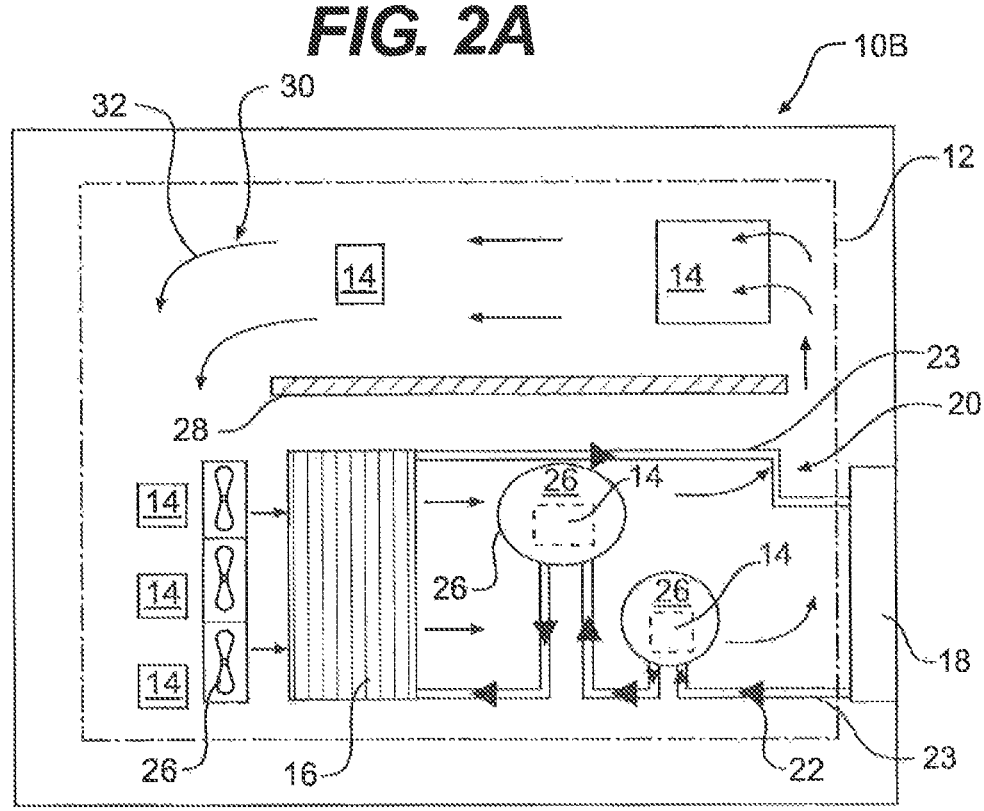
FIG. 2B is an illustration of another exemplary embodiment of the disclosed cooling system applied to a server module.

FIG. 2B illustrates another embodiment of a module having an air cooling system 30 and a liquid cooling system 20. Similar to module 10A of FIG. 2A, module 10B of FIG. 2B may be configured to transfer heat from air 32 circulating within the module 10B to the coolant 22 circulating within a liquid cooling system 20. In addition to cooling the air 32 within the module 10B, the liquid cooling system 20 of module 10B may also directly cool one or more electronic devices 14 of the module 10B. To directly cool an electronic device 14, a cold plate 26 of the liquid cooling system 10 may be placed in thermal contact (directly in contact, or in contact through a heat transfer medium, such as, for example, thermal grease or a thermal pad) with the electronic device 14. Because of thermal contact, heat may be transferred from the electronic device 14 to the cold plate 26. The coolant 22 of the liquid cooling system 20 may pass through the cold plate 26 to remove heat from, and thereby cool, the cold plate 26. Any type of cold plate 26 configured to transfer heat from the electronic device 14 to the coolant 22 circulating within liquid cooling system 20 may be used as the cold plate 26. The cold plate 26 may include fins, pins, or other such features to assist in transferring the heat from the cold plate 26 to the coolant 22. In some embodiments, devices used to transfer heat from heat generating electronic devices to the coolant in co-assigned patent application Ser. Nos. 10/578,578, 11/919,974, 12/826,736, 12/914,190, and 12/914,263, with appropriate modifications, may be used as cold plate 26. These patent applications are incorporated by reference herein in their entirety. Although FIG. 2B illustrates two electronic devices 14 as being directly cooled by the liquid cooling system 20, this is only exemplary. In general, any number of electronic devices 14 of module 10B may be directly cooled by the liquid cooling system 20.

HEX 16 may be any type of heat exchanger that is configured to transfer heat from hotter air 32 flowing outside HEX 16 to cooler coolant 22 flowing within HEX 16. For instance, in some embodiments, HEX 16 may be a cross-flow, parallel-flow, or a counter-flow heat exchanger that is used to transfer heat from air to liquid circulating within the heat exchanger. The air 32 within modules 10A and 10B of FIGS. 2A and 2B, respectively, may be blown through the HEX 16 using one of more fans 26 positioned within the module. Although only a single set of fans 26 is illustrated FIGS. 2A and 2B, this is only exemplary. In general, fans 26 may be positioned at any location within a module to achieve a desired circulation of air within the module. Similarly although only one HEX 16 is illustrated in FIGS. 2A and 2B, any number of heat exchangers may be positioned in a module to achieve a desired temperature distribution in a module.

Figure 2C:
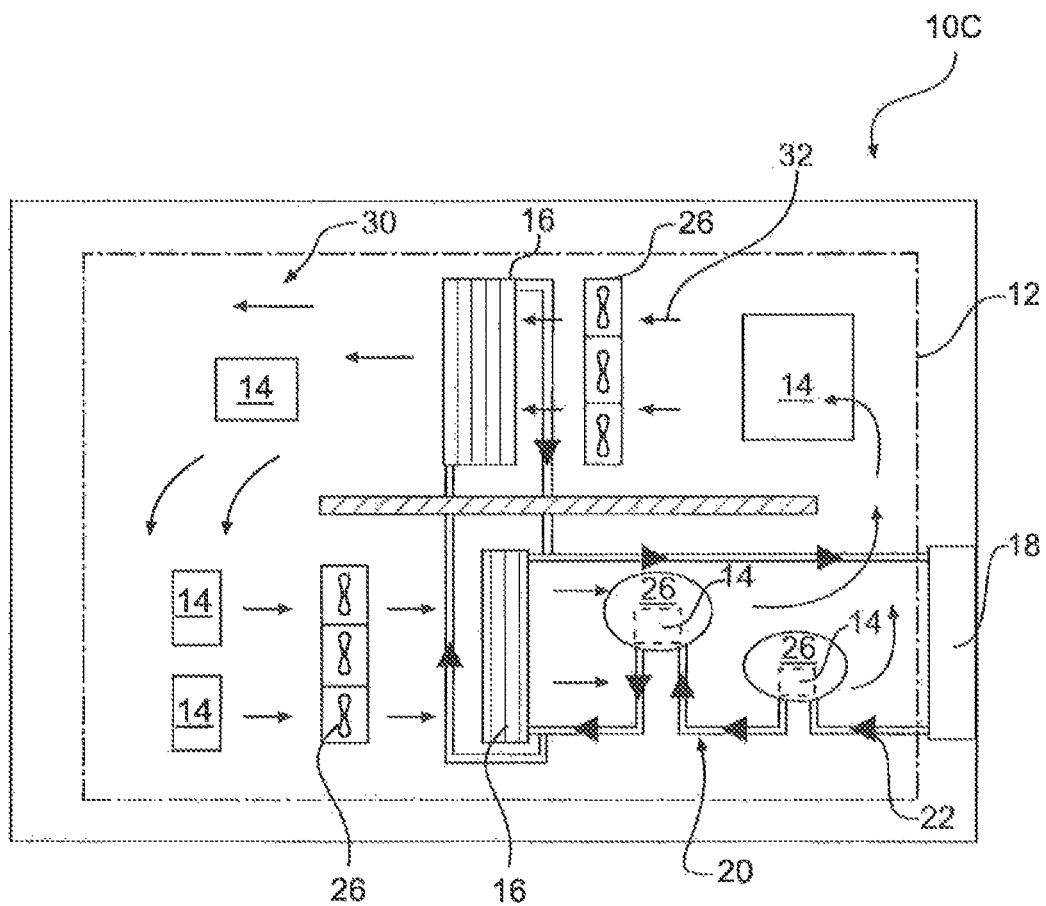
FIG. 2C is an illustration of another exemplary embodiment of the disclosed cooling system applied to a server module.

FIG. 2C illustrates an embodiment of a module 10C including two HEXs 16 and two sets of fans 26 positioned in the module 10C. In general, the location of the HEXs 16 and the fans 26 may be selected based on the relative amounts of heat generated by the different electronic devices 14 in the module 10C. For instance, in some embodiments, a HEX 16 may be positioned proximate (that is, immediately upstream and/or downstream of) a device 14 that produces a relatively large amount of heat. Positioning a HEX 16 upstream of such a device 14 may more effectively cool the device 14 by cooling the air 32 used to remove heat from the device 14. And, positioning a HEX 16 immediately downstream of a high heat generating device 14 may cool the air 32 heated by the device 14, and thereby enable more effective cooling of other electronic devices 14 in the module 10C. Typically, a set of fans 26 may be positioned upstream of a HEX 16 to drive the air 32 through the HEX 16. However, it is also contemplated that in some embodiments, fans 26 may be positioned downstream of a HEX 16 to pull the air 32 through the HEX 16.

Figure 3:
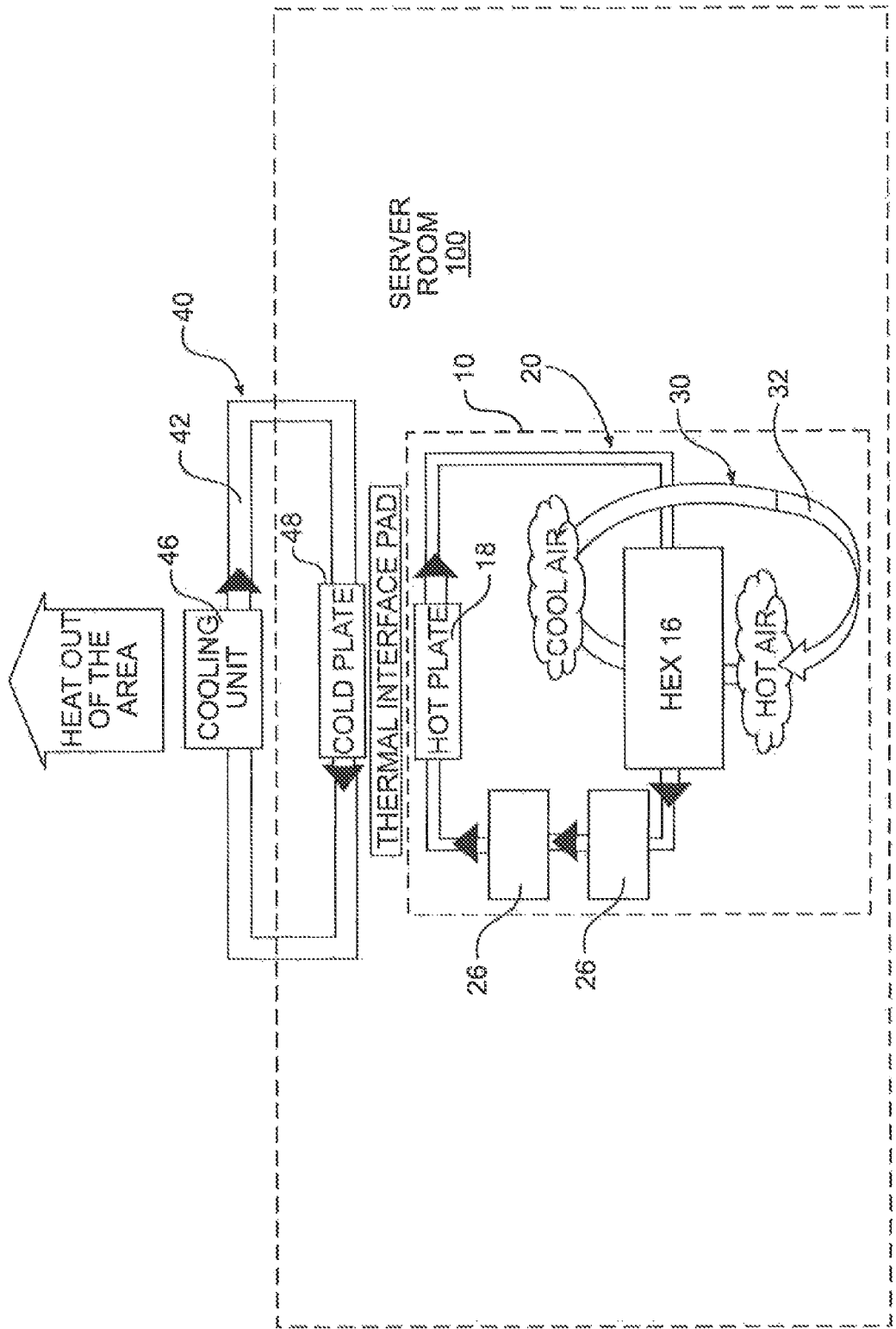
FIG. 3 is a schematic illustrating an exemplary embodiment of the disclosed cooling system.

With reference to FIG. 3, in some embodiments, a module (10A, 10B, 10C, collectively module 10) may be sealed to minimize the transfer of air from inside the module to outside the module. In such embodiments, free flow of air between the module 10 and the server room 100 may be prevented. That is, module 10 may not include passages and other openings that are typically provided in the chassis of a computer system to allow air to flow into and out of the computer system. In these embodiments, substantially all the air 32 within the module 10 may stay within the module 10. However, it should be noted that a perfect seal between the module 10 and the server room 100 is not a requirement, and some transfer of air between the module 10 and the server room 100 may be unavoidable due to leaks, gaps between panels of the module chassis, cracks in the panels, etc. That is, in an embodiment of the module 10 that is substantially sealed to prevent the flow of air between the server room 100 and the module 10, the module 10 may be substantially free of openings and other passages that permit the free transfer of air between the module 10 and the server room 100. In such a module 10, a majority of heat from the module 10 may be removed by the liquid cooling system 20. The heated air 32 in the module 10 may heat the chassis of the module 10, and some amount of heat transfer may occur as a result of heat transfer from the chassis to the server room, and as a result of leakage of air 32 from the module 10. However, it is expected that a majority of heat from module 10 may be transferred through the liquid cooling system 20.

Liquid cooling system 20 may transfer the heat absorbed in module 10 to a second cooling system 40. The second cooling system may be a cooling system that is associated with server room 100 or the enclosed environment within which the modules 10 are located. Second cooling system 40 may circulate a thermal transfer medium 42 (any fluid, such as a liquid or a gas) therethrough to absorb heat from the liquid cooling systems 20 associated with different modules 10, and discharge the heat remote from these modules 10. Any type of fluid, such as water, alcohol, mixtures thereof, a gas, etc. may be used as thermal transfer medium 42. It is also contemplated that, in some embodiments, a phase change material may be used as the thermal transfer medium 42. In some embodiments, second cooling system 40 may be a closed loop cooling system. However, it is contemplated that in other embodiments, the second cooling system 40 may be an open loop system. In some embodiments, as illustrated in FIG. 3, second cooling system 40 may absorb heat from one or modules 10 positioned in the server room 100, and discharge the heat outside the server room 100. The second cooling system 40 may consist of one or more cold plate elements 48, a cooling device 46 disposed external to server room 100, and conduits to transfer the thermal transfer medium 42 between the cooling device 46 and the cold plate elements 48. The thermal transfer medium 42, may be circulated between the cooling device 46 and the cold plate elements 48 of the modules 10 of several servers positioned in the server room. The circulating thermal transfer medium 42 may thus draw heat from the hot plates 18 of these modules 10 and discharge the heat external to the server room 100. In some embodiments, pumps and/or other control devices may be provided to assist in directing the thermal transfer medium 42 through the second cooling system 40. Transferring the heat generated by the servers outside the server room 100 avoids heating the air in the server room, and thus reduces the cooling load of the server room cooling system. It is also contemplated that the heat removed from the server room by thermal transfer medium 42 may be used to do useful work. For instance, this removed heat may be used in an HVAC system to heat a building.

Figure 4:
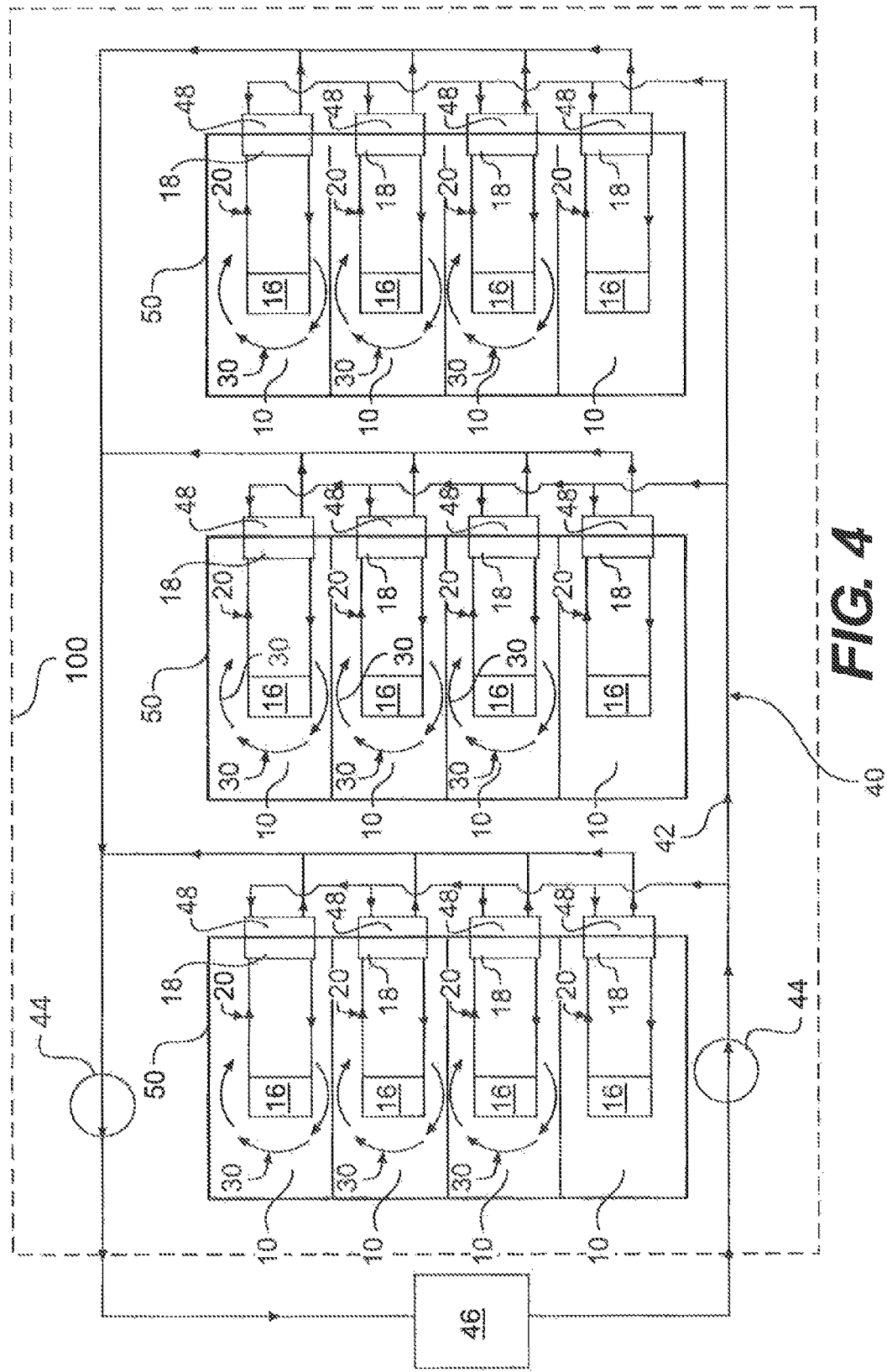
FIG. 4 is an illustration of an exemplary embodiment of the disclosed cooling system applied to multiple server units.

In a server application, as illustrated in FIG. 4, several modules 10, having a liquid cooling system 20 and an air cooling system 30 therein, may be mounted on a rack 50 positioned in the server room 100. The server room 100 may include several racks 50 with modules 10 mounted thereon. A cold plate 48 associated with the second cooling system 40 may thermally couple to, and remove heat from, the hot plates 18 associated with the liquid cooling system 20 of each of these modules 10. In some embodiments, to assist in thermally coupling the cold plate 48 to the hot plates 18, the hot plates 18 may be positioned proximate to, or on mounted on, the chassis of the modules 10 with a surface exposed to the server room 100. In these embodiments, a surface of the cold plates 48 may be placed in thermal contact with the exposed surface of the hot plates 18 for transfer of heat therebetween. In some embodiments, the second cooling system 40 may circulate the thermal transfer medium 42 through the cold plates 48 using one or more pumps 44 to transfer the heat from the hot plates 18 to the cooling device 46 outside the server room 100. The cooling device 46 may be any type of device (such, as a chiller, a heat exchanger, etc.) adapted to remove heat from the thermal transfer medium 42 passing therethrough. In some embodiments, each module 10 in a rack 50 may include both a liquid cooling system 20 and an air cooling system 30. However, in some embodiments (as illustrated in FIG. 4), one or more modules 10 of a rack 50 may include only a liquid cooling system 20. In some such embodiments, these one or more modules 10 may include openings or passages that permit transfer of air between the server room 100 and the module 10. That is, in such embodiments, the modules 10 of the rack 50 that do not include an air cooling system 40 may not be substantially sealed from the server room 100.

In some embodiments (such as in blade server applications where each module 10 may not be enclosed in a separate chassis), each module 10 of a rack 50 may not be individually sealed from the server room 100. In these embodiments, air 32 may flow between the modules 10 in a rack 50, and the rack 50 may be substantially sealed from the server room 100. Although a particular flow path of the thermal transfer medium 42 is illustrated in FIG. 4, this is only exemplary. In general, the thermal transfer medium 42 may be circulated through the server room 100 in any pattern. Further, although FIG. 4 illustrates each module 10 associated with a rack 50 as having a liquid cooling system 20 therein, this is only exemplary. It is contemplated that, in some embodiments, only some of the modules 10 in a rack 50 may include a liquid cooling system 20, and only a selected ones of these modules may thermally couple with the second cooling system 40.

Figure 5A:
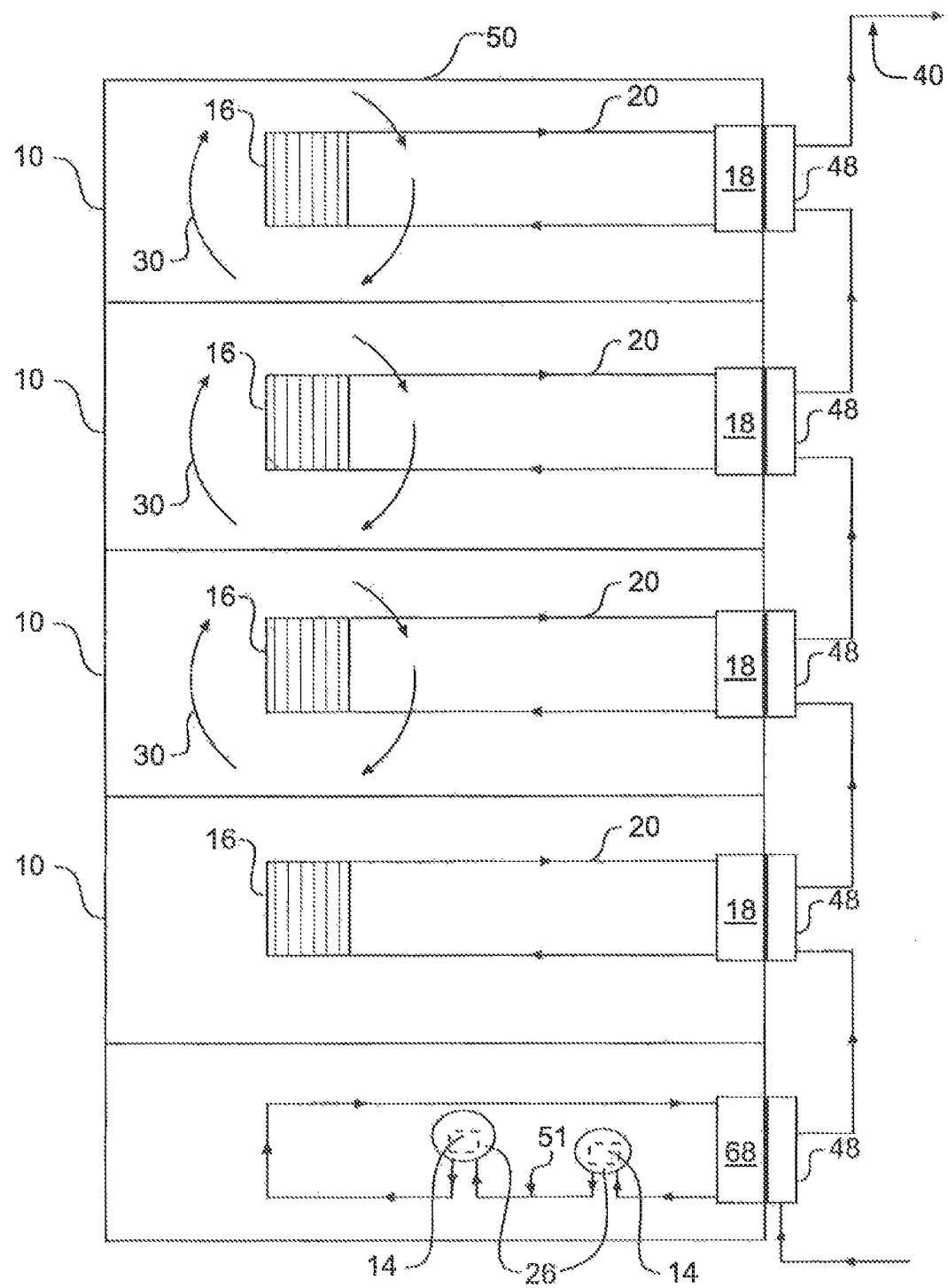
FIG. 5A is an illustration of an exemplary embodiment of the disclosed cooling system applied to an exemplary server unit.

In some server applications, in addition to the heat generated in the modules 10, the rack 50 may itself generate heat. For instance, in some server applications, the modules 10 in a rack 50 may not include separate power supplies. Instead, the power supplies may be located in the rack 50, and the rack 50 may deliver the required power to the modules 10 mounted in the rack 50. In such embodiments, as illustrated in FIG. 5A, the rack 50 may include a rack-level cooling system 51 with a hot plate 68 that mates with a cold plate 48 of the second cooling system 40. The rack-level cooling system 51 may be a closed loop liquid cooling system that circulates a liquid coolant to remove heat from the electronic devices 14 of the rack 50. Cold plates 26 of the rack-level cooling system 51 may thermally couple with and remove heat from electronic devices 14 of the rack 50, and transfer the heat to the hot plate 68 positioned proximate (or on the chassis with a surface exposed to the server room 100) an external surface of the rack 50. A cold plate 48 of the second cooling system 40 may thermally couple with and remove heat from the hot plate 68 of the rack-level cooling system 51.

Figure 5B:
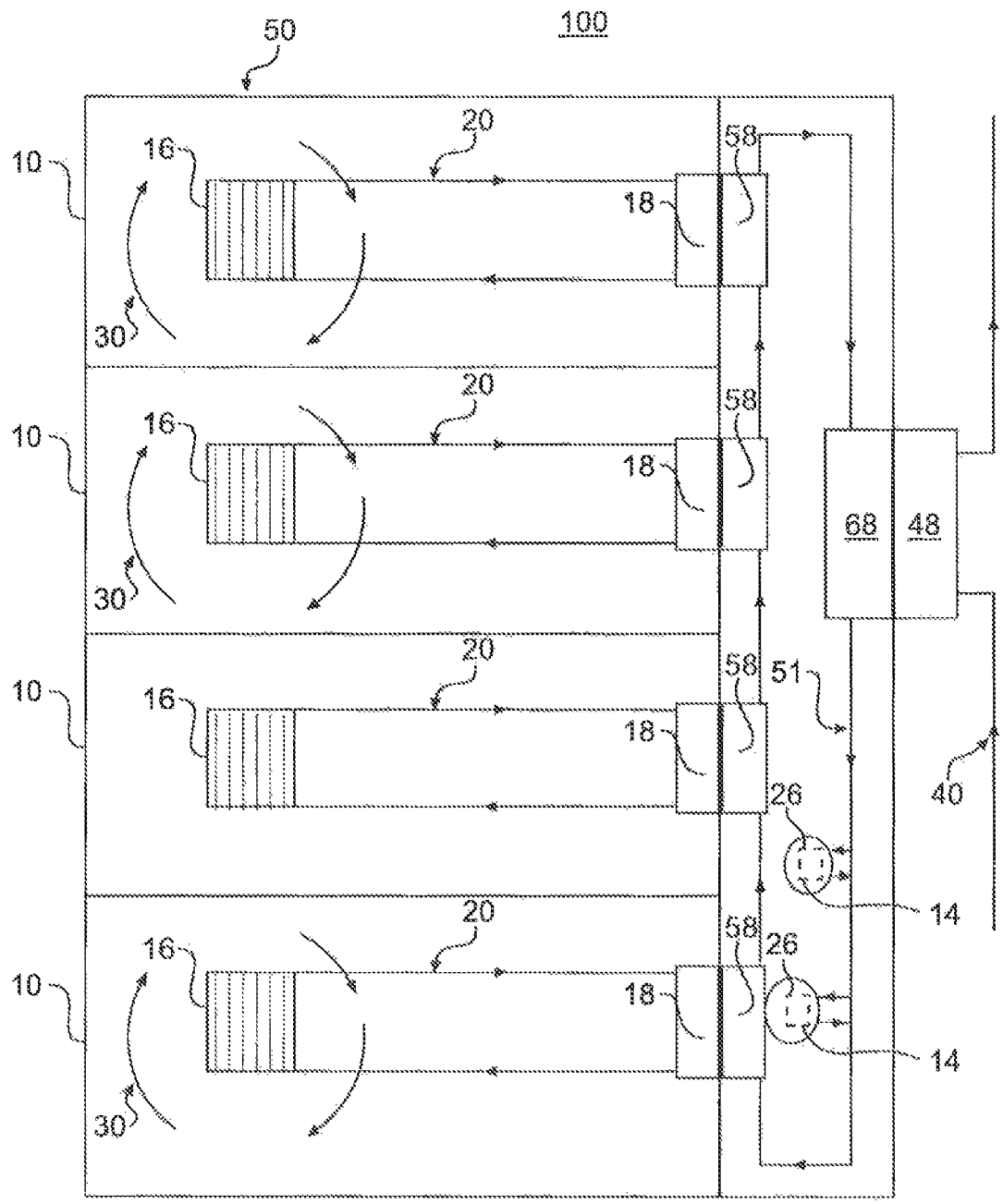
FIG. 5B is an illustration of another exemplary embodiment of the disclosed cooling system applied to an exemplary server unit.

In some embodiments, as illustrated in FIG. 5B, in addition to cold plates 26 that remove heat from electronic devices 14 of the rack 50, the rack-level cooling system 51 may include multiple cold plates 58 that thermally couple with the hot plates 18 of the modules 10. In such an embodiment, the rack-level cooling system 51 may remove heat from the modules 10, and transfer the heat to the second cooling system 40 through a hot plate 68 placed in thermal contact with the cold plate 48 of the second cooling system 40.

A hot plate (18, 68) and a cold plate (48, 58) may be any component that enables heat transfer between a coolant and a heat exchange surface. In some embodiments, a hot plate and a cold plate may be substantially similar components that mate with each to transfer heat therebetween. For the sake of brevity, only hot plate 18 of liquid cooling system 20 may be described herein. The other hot plates (such as, hot plate 68) and cold plates (48, 58) may be substantially similar in structure to hot plate 18. FIGS. 6A and 6B illustrate an exemplary embodiment of hot plate 18 that may be used to transfer heat from coolant 22 of the liquid cooling system 20. FIG. 6A shows a perspective view of the hot plate 18, while FIG. 6B shows a view with the cover partially removed to show the structure within. In the description below, reference will be made to both FIGS. 6A and 6B. The hot plate 18 may include a conductive plate 72 and a cover 74. The conductive plate 72 may be made of any thermally conductive material (such as, for example, copper, aluminum, etc) and the cover 74 may be made of either a conductive or a non-conductive material. The cover 74 and the conductive plate 72 may attached together to define a reservoir 76 therebetween. The cover 74 may be attached to the conductive plate 72 in any manner, such as, for example, using an adhesive, solder, braze, or by another known mechanism. The coolant 22 of the liquid cooling system 20 may circulate through the reservoir 76 to transfer heat from the coolant 22 to the conductive plate 72. The cover 74 may include openings for an inlet 78a and an outlet 78b for reservoir 76. Conduits 22a and 22b couple with the inlet 78a and the outlet 78b to direct the coolant 22 into and out of the reservoir 76. The size of the conductive plate 72 and the reservoir 76 may be selected so that the hot plate 18 can fit within the available space in module 10 while providing the necessary surface area for cooling.

Conductive plate 72 of hot plate 18 may include a first surface 72a exposed to reservoir 76 and an opposing second surface 72b. First surface 72a may include fins 73 that project from the first surface 72a into the reservoir 76. These fins 73 may include multiple plates oriented parallel to each other. These fins 73 may be adapted to absorb heat from the coolant 22 that passes through reservoir 76. The fins 73 may function to increase the area of contact of the coolant 22 to the first surface 72a and serve to generate turbulence in the coolant 22 flowing through the reservoir 76. Although the fins 73 are depicted as parallel plates in FIG. 6B, the fins 73 may alternatively or additionally include other structures (such as pins, etc.). Conductive plate 72 may mate with the cover 74 and form a liquid-tight seal. The second surface 72b of conductive plate 72 may be thermally coupled to a second surface of a cold plate (such as, for example, cold plates 48 and 58) to transfer heat from the hot plate 18 to the thermally coupled cold plate. In some embodiments, the hot plate 18 may be mounted in a module 10 such that the second surface 72b is exposed to the server room 100. In some embodiments, the second surface 72b may be substantially flat while in other embodiments, second surface 72b may include features (such as alignment features) that assist in aligning the hot plate 18 to a cold plate. In some embodiments, a thermally coupled hot plate-cold plate pair may include retention features that enable the hot plate to couple with a cold plate efficiently. These features may include mating bolt and hole pairs and or other known features. In some embodiments, cold plate 18 may include snap-on features that enable the hot plate 18 to snap on to, and thermally couple with a cold plate (such as, cold plate 58 of FIG. 5B, or cold plate 48 of FIG. 5A) when a module 10 is slid into a rack 50. In some embodiments, this snap-on feature may be configured to separate and allow the module 10 to be pulled out of rack 50 when a pulling force is applied.

The disclosed server cooling system in which a liquid cooling system 20 of a module 10 of a server rack 50 mates with and transfers heat to a second cooling system 40 of the server room 100, enables the servers to be cooled without transferring the heat to the server room 100 Since the server room 100 is not heated, the necessity of large CRAC systems are eliminated. As discussed in the background section, the electrical power consumed to operate a CRAC system of a server room accounts for a large portion of the total server room power consumption. Although the cooling device 46 of the second cooling system 40 consumes power, this power consumption will be significantly less than that necessary to operate the CRAC system. Eliminating the need for large CRAC systems to cool the server room 100 thereby reduces power consumption associated with cooling the server room. This reduction in power consumption enables more efficient utilization and conservation of available energy resources, and concomitant reduction in green house gas emissions. Since additional modules 10 can be added to a server rack 50 without breeching a liquid cooling system, the danger of liquid spillage within a server is also eliminated.

It will be apparent to those skilled in the art that various modifications and variations can be made to the disclosed cooling systems. Other embodiments will be apparent to those skilled in the art from consideration of the specification and practice of the disclosed cooling systems. It is intended that the specification and examples be considered as exemplary only, with a true scope being indicated by the following claims and their equivalents.

What is claimed is:

1. A cooling system for a computer server rack comprising at least one server module, the cooling system comprising:
   a first liquid cooling loop comprising at least one first cold plate placed in thermal contact with a heat generating component of the server module, and a first plurality of conduits configured to circulate a first liquid cooling medium through the at least one first cold plate;
   a second liquid cooling loop comprising a second plurality of conduits configured to circulate a second liquid cooling medium therethrough; and
   a first liquid-to-liquid heat exchanger fluidly coupled to the first cooling loop and the second cooling loop and configured to transfer heat from the first liquid cooling medium to the second liquid cooling medium.

2. The cooling system of claim 1, wherein the liquid-to-liquid heat exchanger is positioned proximate to the server module.

3. The cooling system of claim 1, wherein the liquid-to-liquid heat exchanger is mounted on the server module.

4. The cooling system of claim 1, wherein the second liquid cooling loop comprises a cooling device configured to draw heat from the second liquid cooling medium.

5. The cooling system of claim 4, wherein the cooling device is positioned remote from the server rack.

6. The cooling system of claim 4, wherein the cooling device comprises a heat exchanger.

7. The cooling system of claim 6, wherein the heat exchanger is a second liquid-to-liquid heat exchanger.

8. The cooling system of claim 4, wherein the cooling device comprises a chiller.

9. The cooling system of claim 1, wherein the second liquid cooling loop comprises at least one pump to drive the second liquid cooling medium through the second liquid cooling loop.

10. The cooling system of claim 1, wherein the at least one first cold plate comprises fins, pins, or other features configured to assist in the transfer of heat from the cold plate to the first liquid cooling medium.

11. The cooling system of claim 1, wherein the first liquid cooling loop comprises at least one pump to drive the first liquid cooling medium through the first liquid cooling loop.

12. The cooling system of claim 1, wherein the first liquid-to-liquid heat exchanger comprises a heat sink and a second cold plate in thermal contact with each other.

13. The cooling system of claim 12, wherein the heat sink is fluidly coupled to the first plurality of conduits, and the second cold plate is fluidly coupled to the second plurality of conduits.

14. The cooling system of claim 12, wherein the heat sink comprises a conductive plate having a first surface exposed to the first liquid cooling medium and a second surface in thermal contact with the second cold plate.

15. The cooling system of claim 14, wherein the first surface of the conductive plate comprises fins adapted to facilitate transfer of heat from the first liquid cooling medium to the second cold plate.

* * * * *